(12) United States Patent
Wang et al.

(10) Patent No.: US 9,165,625 B2
(45) Date of Patent: Oct. 20, 2015

(54) ST-RAM CELLS WITH PERPENDICULAR ANISOTROPY

(75) Inventors: Dexin Wang, Eden Prairie, MN (US); Haiwen Xi, Prior Lake, MN (US); Yuankai Zheng, Bloomington, MN (US); Dimitar Dimitrov, Edina, MN (US)

(73) Assignee: Seagate Technology LLC, Cupertino, CA (US)

( * ) Notice: Subject to any disclaimer, the term of this patent is extended or adjusted under 35 U.S.C. 154(b) by 1614 days.

(21) Appl. No.: 12/398,214

(22) Filed: Mar. 5, 2009

(65) Prior Publication Data

US 2010/0109110 A1    May 6, 2010

Related U.S. Application Data

(60) Provisional application No. 61/109,568, filed on Oct. 30, 2008.

(51) Int. Cl.
*H01L 29/82* (2006.01)
*G11C 11/16* (2006.01)
*H01L 43/08* (2006.01)

(52) U.S. Cl.
CPC ............... *G11C 11/16* (2013.01); *H01L 43/08* (2013.01)

(58) Field of Classification Search
USPC ........................................................ 257/421
See application file for complete search history.

(56) References Cited

U.S. PATENT DOCUMENTS

| | | | |
|---|---|---|---|
| 6,462,919 B1 | 10/2002 | Mack | |
| 6,650,513 B2 | 11/2003 | Fullerton et al. | |
| 6,714,444 B2 | 3/2004 | Huai | |
| 6,819,532 B2 | 11/2004 | Kamijo | |
| 6,829,161 B2 | 12/2004 | Huai | |
| 6,838,740 B2 | 1/2005 | Huai | |
| 6,847,547 B2 | 1/2005 | Albert | |
| 6,888,742 B1 | 5/2005 | Nguyen | |
| 6,933,155 B2 | 8/2005 | Albert | |
| 6,958,927 B1 | 10/2005 | Nguyen | |
| 6,967,863 B2 | 11/2005 | Huai | |
| 6,985,385 B2 | 1/2006 | Nguyen | |
| 6,992,359 B2 | 1/2006 | Nguyen et al. | |
| 7,057,921 B2 | 6/2006 | Valet | |
| 7,088,609 B2 | 8/2006 | Valet | |
| 7,110,287 B2 | 9/2006 | Huai | |
| 7,126,202 B2 | 10/2006 | Huai | |
| 7,161,829 B2 | 1/2007 | Huai | |

(Continued)

OTHER PUBLICATIONS

U.S. Appl. No. 12/233,764 Gao et al., filed Sep. 19, 2008.
U.S. Appl. No. 12/248,237 Zhu, filed Oct. 9, 2008.
U.S. Appl. No. 12/269,537 Tang et al., filed Nov. 12, 2008.

(Continued)

*Primary Examiner* — Zandra Smith
*Assistant Examiner* — Lawrence Tynes, Jr.
(74) *Attorney, Agent, or Firm* — Mueting, Raasch & Gebhardt, P.A.

(57) ABSTRACT

Magnetic spin-torque memory cells, often referred to as magnetic tunnel junction cells, which have magnetic anisotropies (i.e., magnetization orientation at zero field and zero current) of the associated ferromagnetic layers aligned perpendicular to the wafer plane, or "out-of-plane". A memory cell may have a ferromagnetic free layer, a first pinned reference layer and a second pinned reference layer, each having a magnetic anisotropy perpendicular to the substrate. The free layer has a magnetization orientation perpendicular to the substrate that is switchable by spin torque from a first orientation to an opposite second orientation.

9 Claims, 8 Drawing Sheets

(56) References Cited

U.S. PATENT DOCUMENTS

| | | | |
|---|---|---|---|
| 7,180,778 | B2 | 2/2007 | Kawai et al. |
| 7,190,611 | B2 | 3/2007 | Nguyen |
| 7,201,977 | B2 | 4/2007 | Li |
| 7,230,845 | B1 | 6/2007 | Wang |
| 7,233,039 | B2 | 6/2007 | Huai |
| 7,241,631 | B2 | 7/2007 | Huai |
| 7,241,632 | B2 | 7/2007 | Yang |
| 7,242,045 | B2 | 7/2007 | Nguyen |
| 7,242,048 | B2 | 7/2007 | Huai |
| 7,245,462 | B2 | 7/2007 | Huai |
| 7,313,013 | B2 | 12/2007 | Sun et al. |
| 7,369,427 | B2 | 5/2008 | Diao |
| 7,394,248 | B1 | 7/2008 | Guo |
| 7,430,135 | B2 | 9/2008 | Huai |
| 7,432,574 | B2 | 10/2008 | Nakamura |
| 7,486,551 | B1 | 2/2009 | Li |
| 7,486,552 | B2 | 2/2009 | Apalkov |
| 7,489,541 | B2 | 2/2009 | Pakala |
| 7,518,835 | B2 | 4/2009 | Huai |
| 7,531,882 | B2 | 5/2009 | Nguyen |
| 7,576,956 | B2 | 8/2009 | Huai |
| 2004/0136231 | A1* | 7/2004 | Huai et al. ............ 365/158 |
| 2005/0135020 | A1* | 6/2005 | Sugita et al. .......... 360/324 |
| 2005/0185455 | A1 | 8/2005 | Huai |
| 2005/0201023 | A1 | 9/2005 | Huai |
| 2006/0132990 | A1 | 6/2006 | Morise |
| 2006/0187705 | A1 | 8/2006 | Nakamura |
| 2006/0203503 | A1 | 9/2006 | Casenave |
| 2007/0008661 | A1 | 1/2007 | Min |
| 2007/0048485 | A1 | 3/2007 | Jogo |
| 2007/0054450 | A1 | 3/2007 | Hong |
| 2007/0063237 | A1 | 3/2007 | Huai et al. |
| 2007/0086121 | A1 | 4/2007 | Nagase |
| 2007/0096229 | A1 | 5/2007 | Yoshikawa |
| 2007/0097734 | A1 | 5/2007 | Min |
| 2007/0120210 | A1 | 5/2007 | Yuan |
| 2007/0176251 | A1 | 8/2007 | Oh |
| 2007/0188942 | A1 | 8/2007 | Beach |
| 2007/0230068 | A1* | 10/2007 | Gill ...................... 360/324.2 |
| 2007/0252186 | A1 | 11/2007 | Yang |
| 2008/0062578 | A1 | 3/2008 | Watanabe |
| 2008/0088980 | A1 | 4/2008 | Kitagawa |
| 2008/0165453 | A1 | 7/2008 | Kaiser |
| 2008/0230819 | A1 | 9/2008 | Nguyen et al. |
| 2008/0273380 | A1 | 11/2008 | Diao |
| 2008/0310213 | A1 | 12/2008 | Chen |
| 2008/0310219 | A1 | 12/2008 | Chen |
| 2009/0050991 | A1 | 2/2009 | Nagai |
| 2009/0079018 | A1* | 3/2009 | Nagase et al. ............ 257/421 |
| 2009/0237987 | A1 | 9/2009 | Zhu |
| 2009/0302403 | A1 | 12/2009 | Nguyen |
| 2010/0032738 | A1* | 2/2010 | Zhu ...................... 257/295 |
| 2010/0032777 | A1* | 2/2010 | Gao et al. ............... 257/421 |
| 2010/0033880 | A1* | 2/2010 | Dimitrov et al. ........ 360/324.1 |
| 2010/0034008 | A1* | 2/2010 | Wang et al. ............. 365/145 |
| 2010/0034017 | A1* | 2/2010 | Rivkin et al. ........... 365/171 |
| 2010/0073984 | A1* | 3/2010 | Xi et al. ................ 365/80 |
| 2010/0091546 | A1* | 4/2010 | Liu et al. ............... 365/97 |
| 2011/0043939 | A1* | 2/2011 | Nolan et al. ............. 360/55 |

OTHER PUBLICATIONS

Diao et al., "Spin-transfer switching in MgO-based magnetic tunnel junctions" J. Appl. Phys. 99, 08G510 (2006).

Jiang et al., "Temperature Dependence of Current-Induced Magnetization Switching in Spin Valves with a Ferromagnetic CoGd Free Layer" Phys. Rev. Lett. 97, 217202 (2006).

Li et al., "Effects of MgO tunnel barrier thickness on magnetohysteresis in perpendicularly magnetized magnetic tunnel junctions of GdFeCo/FeCo/MgO/FeCo/TbFe/Co" J. Appl. Phys. 99, 08T310 (2006).

Meng et al., "Spin transfer in nanomagnetic devices with perpendicular anisotropy" J. Appl. Phys. 99, 08G519 (2006).

Nakayama et al., "Spin transfer switching in TbCoFe/CoFeB/MgO/CoFeB/TbCoFe magnetic tunnel junctions with perpendicular magnetic anisotropy" J. Appl Phys. vol. 103, 07A710 ( 2008).

Nishimura et al., "Magnetic tunnel junction device with perpendicular magnetization films for high-density magnetic random access memory" J. Appl. Phys. 91, 5246 (2002).

Xi et al., "Perpendicular magnetization and exchange bias in epitaxial Cu/Ni/Fe50Mn50 thin films" Phys. Rev. B 72, 024447 (2005).

U.S. Appl. No. 12/326,274, filed Dec. 2, 2008, Inventor: Dimitrov.

PCT Search Report and Written Opinion dated Jun. 14, 2010.

Berger, Physic Rev. B 54, 9353 (1996).

Hosomi, H. Yamagishi, T. Yamamoto, K. Bessho, Y. Higo, K. Yamane, H. Yamada, M. Shoji, H. Hachino, C. Fukumoto, H. Nagao and H. Kano, "A Novel Nonvolatile Memory with Spin Torque Transfer Magnetization Switching: Spin-RAM," Electron Devices Meeting, IEDM Technical Digest, 2005, pp. 459-462, IEEE.

Mangin, D. Ravelosona, J. A. Katine, J. J. Carey, B. D. Terris and E. E. Fullerton, "Current-induced magnetization reversal in nanopillars with perpendicular anisotropy," Nature Materials, 2006, pp. 210-215, vol. 5, Nature Publishing Group.

Miura, T. Kawahara, R. Takemura, J. Hayakawa, S. Ikeda, R. Sasaki, H. Takahashi, H. Matsuoka and H. Ohno, "A novel SPRAM (SPin-transfer torque RAM) with a synthetic ferrimagnetic free layer for higher immunity to read disturbance and reducing write-current dispersion," 2007 Symposium on VLSI, Technology Digest of Technical Papers, pp. 234-235.

Ohmori, H. et al., Perpendicular Magnetic Tunnel Junction with Tunneling Magnetoresistance Ratio of 64% Using MgO (100) Barrier Layer Prepared at Room Temperature, Journal of Applied Physics, 103, 07A911 (2008).

PCT Search Report and Written Opinion dated Jul. 21, 2010.

Sbbia, Rachid et al., Spin Transfer Switching Enhancement in Perpendicular Anisotropy Magnetic Tunnel Junctions with a Canted in-Plan Spin Polarizer, Journal of Applied Physics, American Institute of Physics, New York, U.S. LNKD-DOI:10.1063/1.3055373, vol. 105, No. 1., Jan. 6, 2009, pp. 13910, XP012119458.

Slonczewski, J.C. Current-driven excitation of magnetic multilayers. Journal of Magnetism and Magnetic Materials 159, L1-L7 (1996).

Sun, J.Z. Spin-current interaction with a monodomain magnetic body: a model study. Phys. Rev. B 62, 570 (2000).

U.S. Appl. No. 12/200,034 Xi et al., filed Aug. 28, 2009.

Xi, Haiwen and Robert M. White, Antiferromagnetic Thickness Dependence of Exchange Biasing, Physical Review B, vol. 61, No. 1, Jan. 1, 2000-1.

* cited by examiner

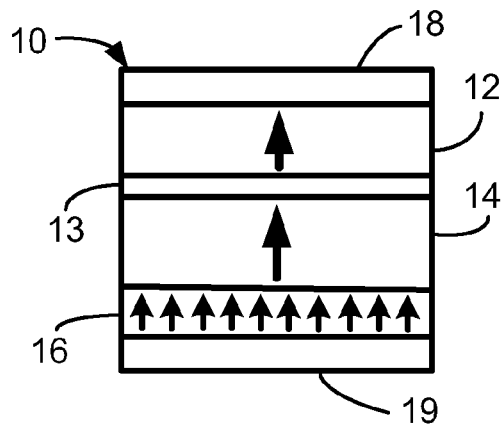
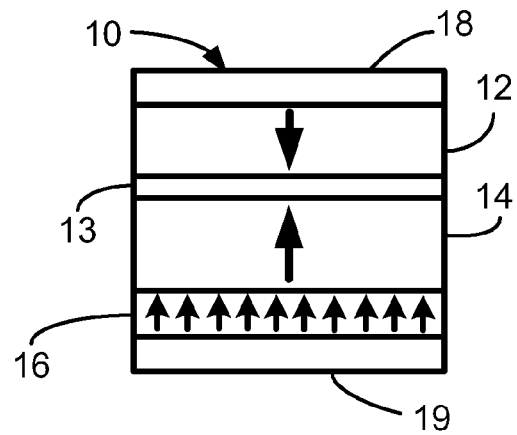
FIG. 1A    FIG. 1B
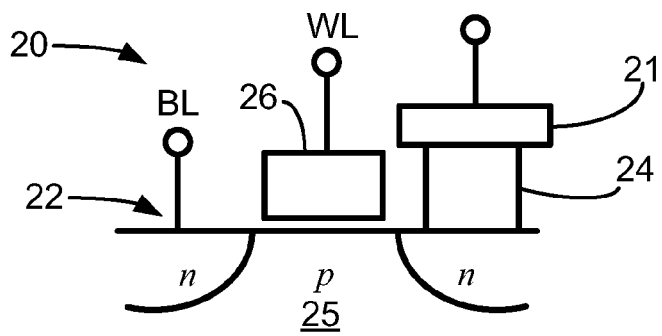
FIG. 2
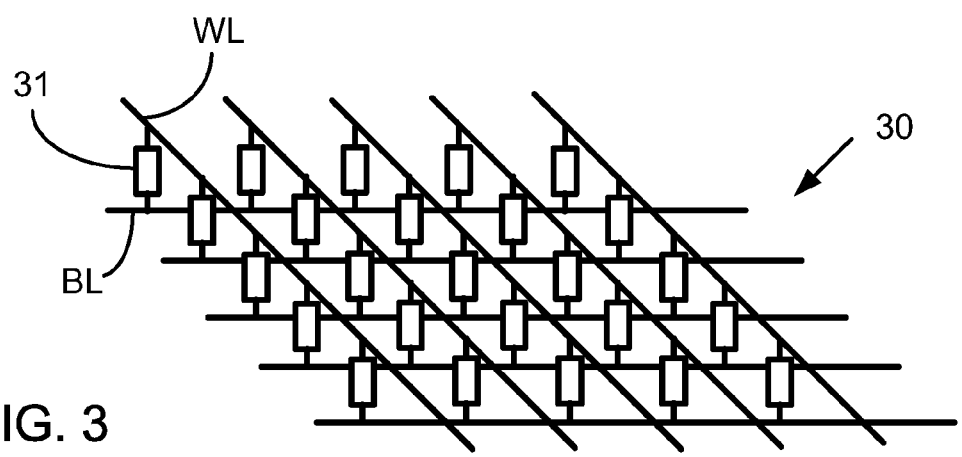
FIG. 3

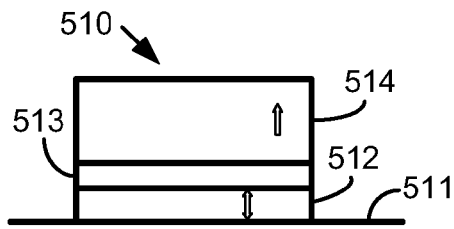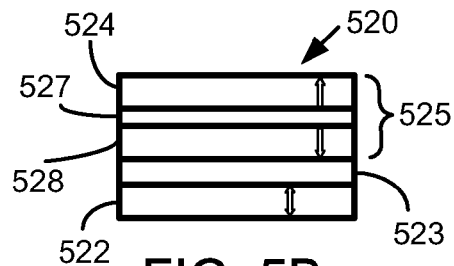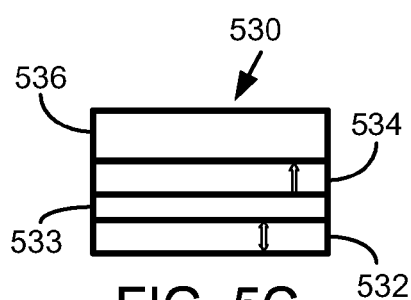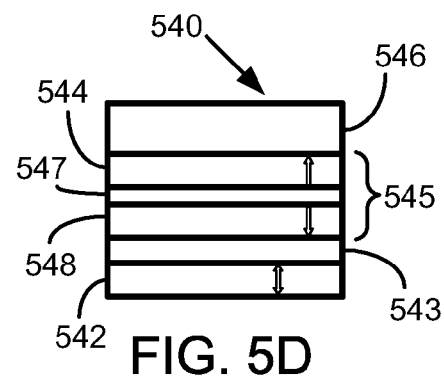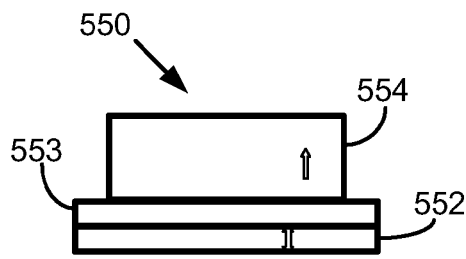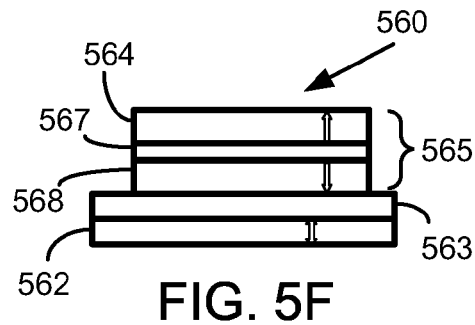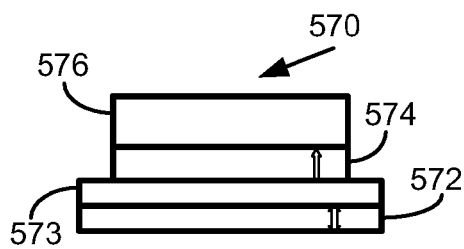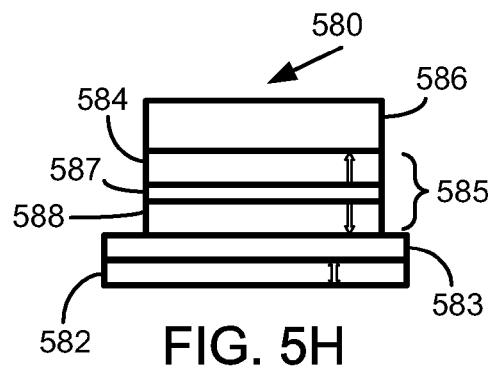

ST-RAM CELLS WITH PERPENDICULAR ANISOTROPY

RELATED APPLICATION

This application claims priority to U.S. provisional patent application No. 61/109,568, filed on Oct. 30, 2008 and titled "Novel ST-RAM Cells with Perpendicular Anisotropy". The entire disclosure of application No. 61/109,568 is incorporated herein by reference.

BACKGROUND

New types of memory have demonstrated significant potential to compete with commonly utilized forms of memory. For example, non-volatile spin-transfer torque random access memory (referred to herein as ST-RAM) has been discussed as a "universal" memory. Magnetic tunnel junction cells have has attracted much attention for their application in ST-RAM due to their high speed, relatively high density and low power consumption.

Most activities have been focused on magnetic tunnel junction cells with in-plane magnetic anisotropies. However, there are limits on how low the switching current can be for adequate thermal stability, which further limits the size of the CMOS transistor which ultimately limits the density of the memory array. In addition, there is very low tolerance of the cell shape and edge roughness, which can be challenging photolithographic techniques. Techniques, designs and modifications designed to improve magnetic tunnel junction cell structures and materials remain an important area of advancement to maximize the advantages of ST-RAM.

BRIEF SUMMARY

The present disclosure relates to magnetic spin-torque memory cells, often referred to as magnetic tunnel junction cells, which have magnetic anisotropies (i.e., magnetization orientation) of the associated ferromagnetic layers aligned perpendicular to the wafer plane, or "out-of-plane".

One particular embodiment of this disclosure is a memory cell having a ferromagnetic free layer, a first pinned reference layer and a second pinned reference layer, each having a magnetic anisotropy perpendicular to the substrate. The free layer has a magnetization orientation perpendicular to the substrate that is switchable by spin torque from a first orientation to an opposite second orientation. The magnetization of the free layer is coupled to each of the first pinned reference layer and the second pinned reference layer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 1A is a schematic side view diagram of an illustrative magnetic tunnel junction memory cell with out-of-plane magnetization orientation in a low resistance state; FIG. 1B is schematic side view diagram of the illustrative magnetic tunnel junction memory cell in a high resistance state;

FIG. 2 is a schematic diagram of an illustrative memory unit including a memory cell and a semiconductor transistor;

FIG. 3 is a schematic diagram of an illustrative memory array;

FIGS. 5A-5H are schematic side view diagrams of magnetic tunnel junction memory cells having top pinned reference layers;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 4A:
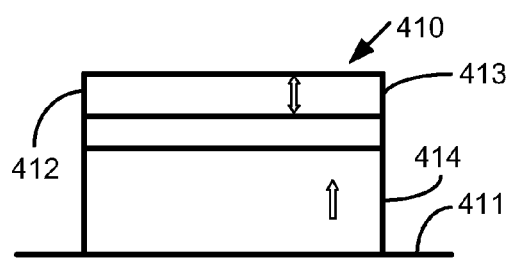
FIGS. 4A-4H are schematic side view diagrams of magnetic tunnel junction memory cells having bottom pinned reference layers.

The present disclosure is directed to various designs of magnetic tunnel junction memory cells having magnetic anisotropies that result in the magnetization orientation of the associated ferromagnetic layers to be aligned perpendicular to the wafer plane, or "out-of-plane". The memory cells have various structural elements that reduce the switching current needed to switch the data bit state of the cell while maintaining adequate thermal stability. The memory cells can be patterned on the wafer at a high areal density. Further, the memory cells are more tolerant to process variations.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

While the present disclosure is not so limited, an appreciation of various aspects of the disclosure will be gained through a discussion of the examples provided below.

FIGS. 1A and 1B illustrate an illustrative memory cell having perpendicular or out-of-plane magnetic orientation. Magnetic tunnel junction memory cell 10 includes a relatively soft ferromagnetic free layer 12, a ferromagnetic reference (e.g., fixed) layer 14, and a pinning layer 16 proximate reference layer 14. Ferromagnetic free layer 12 and ferromagnetic reference layer 14 are separated by an oxide barrier layer 13 or non-magnetic tunnel barrier. Other layers, such as seed or capping layers, are not depicted in these figures for clarity. Free layer 12, reference layer 14 and pinning layer 16 each have an associated magnetization orientation. The magnetization orientation of free layer 12 is more readily switchable than the magnetization orientation of reference layer 14, whereas the magnetization orientation of pinning layer 16 is fixed and generally very low and does not switch. Pinning layer 16 pins the magnetization orientation of pinned reference layer 14. In some embodiments, pinning layer 16 may have a zero magnetization, but still can pin the pinned layer magnetization.

Ferromagnetic layers 12, 14 may be made of any useful ferromagnetic (FM) material such as, for example, Fe, Co or Ni and alloys thereof, such as NiFe and CoFe. Ternary alloys, such as CoFeB, may be particularly useful because of their lower moment and high polarization ratio. Either or both of free layer 12 and reference layer 14 may be either a single layer or an unbalanced synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization. Pinning layer 16 may be an antiferromagnetically ordered material (AFM) such as PtMn, IrMn, and others.

Barrier layer 13 may be made of an electrically insulating material such as, for example an oxide material (e.g., $Al_2O_3$, $TiO_x$ or $MgO_x$). Barrier layer 13 could optionally be patterned with free layer 12 or with reference layer 14, depending on process feasibility and device reliability.

A first electrode 18 is in electrical contact with ferromagnetic free layer 12 and a second electrode 19 is in electrical contact with ferromagnetic reference layer 14. Electrodes 18, 19 electrically connect ferromagnetic layers 12, 14 to a control circuit providing read and write currents through layers 12, 14. The resistance across magnetic tunnel junction memory cell 10 is determined by the relative orientation of the magnetization vectors or magnetization orientations of ferromagnetic layers 12, 14. In the illustrated embodiment, the magnetization orientation of ferromagnetic reference layer 14 is pinned in a predetermined direction by pinning layer 16 while the magnetization direction of ferromagnetic free layer 12 is free to rotate under the influence of spin torque.

The magnetization orientations of layers 12, 14, 16 are oriented perpendicular to the layer extension and to the plane of the wafer substrate on which memory cell 10 is formed, which is often referred to as "out-of-plane" or "perpendicular".

In FIG. 1A, magnetic tunnel junction memory cell 10 is in the low resistance state where the magnetization orientation of free layer 12 is in the same direction as the magnetization orientation of reference layer 14. In FIG. 1B, magnetic tunnel junction memory cell 140 is in the high resistance state where the magnetization orientation of free layer 12 is in the opposite direction of the magnetization orientation of reference layer 14. In some embodiments, the low resistance state may be the "0" data state and the high resistance state the "1" data state, whereas in other embodiments, the low resistance state may be "1" and the high resistance state "0".

Switching the resistance state and hence the data state of magnetic tunnel junction memory cell 10 via spin-transfer occurs when a current, passing through a magnetic layer of magnetic tunnel junction memory cell 10, becomes spin polarized and imparts a spin torque on free layer 12. When a sufficient spin torque is applied to free layer 12, the magnetization orientation of free layer 12 can be switched between two opposite directions and accordingly, magnetic tunnel junction memory cell 10 can be switched between the low resistance state and the high resistance state.

FIG. 2 is a schematic diagram of an illustrative memory unit 20 including a memory element 21 electrically coupled to a semiconductor transistor 22 via an electrically conducting element 24. Memory element 21 may be any of the memory cells described herein, or may be any other memory cell configured for switching data states via a current passed through memory element 21. Transistor 22 includes a semiconductor substrate 25 having doped regions (e.g., illustrated as n-doped regions) and a channel region (e.g., illustrated as a p-doped channel region) between the doped regions. Transistor 22 includes a gate 26 that is electrically coupled to a word line WL to allow selection and current to flow from a bit line BL to memory element 21. An array of programmable metallization memory units 20 can be formed on a semiconductor substrate utilizing semiconductor fabrication techniques.

FIG. 3 is a schematic diagram of an illustrative memory array 30. Memory array 30 includes a plurality of word lines WL and a plurality of bit lines BL forming a cross-point array. At each cross-point a memory element 31, as described herein, is electrically coupled to word line WL and bit line BL.

In this disclosure, various structural designs of magnetic tunnel junction cells with perpendicular magnetic anisotropies are provided. The designs and patterning processes allow reduced switching current with adequate thermal stability, and enable high area density with increased tolerance to process variations.

For memory cells having perpendicular magnetic anisotropy, a stronger coupling is experienced among the pinned reference layers and the free layer than in memory cells having in-plane magnetic anisotropy. This higher coupling results in a lower needed switching current (Ic). It has been found that the perpendicular magnetic anisotropy counterbalances strong demagnetization effects, thus reducing and often eliminating the obstacles for current-induced magnetic reversal, and thus reducing the switching current (Ic).

Each of the memory cell designs are magnetic tunnel junction cells having one or more tunnel barrier layers, a ferromagnetic free layer with perpendicular anisotropy, and one or two ferromagnetic reference layers also with a perpendicular anisotropy. The reference layer(s) may be a single reference layer or a tri-layer unbalanced synthetic antiferromagnetic (SAF) coupled structure. In some embodiments, the memory cell has one or two pinned layers also having perpendicular anisotropy. The memory cells also include various non-magnetic layers and/or metallic spacer layers. It is noted that the cell structures also include seed layer(s) and/or cap layer(s) which are not shown for sake of clarity. The following figures illustrate numerous embodiments of magnetic memory cells having out-of-plane or perpendicular magnetic anisotropy.

The following memory cells, in FIGS. 4A-4H and FIGS. 5A-5H, are embodiments of memory cells having a ferromagnetic free layer with a switchable perpendicular magnetization orientation and a reference layer having a pinned perpendicular magnetization orientation. In general, the memory cells have a ferromagnetic free layer having a magnetic anisotropy perpendicular to the substrate on which the memory cell is formed, the magnetic anisotropy providing a magnetization orientation switchable by spin torque, the memory cell also having a pinned reference layer having a magnetic anisotropy providing a magnetization orientation pinned perpendicular to the substrate, and a first nonmagnetic barrier layer positioned between the free layer and the pinned reference layer. Each of the free layer and the pinned reference layer has an area.

In some embodiments, when the pinned reference layer is positioned between the substrate and the free layer, the free layer area is less than the reference layer area, and when the free layer is positioned between the substrate and the reference layer, the reference layer area is less than the free layer area. In general, these memory cells have a ferromagnetic free layer having a magnetic anisotropy perpendicular to the substrate, the magnetization orientation switchable by spin torque. The memory cells include a pinned reference layer having a magnetic anisotropy and magnetization orientation pinned perpendicular to the substrate, and also a first nonmagnetic barrier layer positioned between the free layer and the pinned reference layer. When the pinned reference layer is positioned between the substrate and the free layer, the free layer area is less than the reference layer area, whereas when the free layer is positioned between the substrate and the reference layer, the reference layer area is less than the free layer area. For the embodiments of memory cells having a reduced area for at least one of the layers (e.g., FIGS. 4E-4H and 5E-5H), the current passing through the memory cell is concentrated as it passes from one layer to the other, due to the smaller area, thus increasing the current density and further reducing the switching current (Ic) needed.

FIGS. 4A-4H illustrate embodiments of memory cells having a pinned reference layer at the bottom of the cell (i.e., proximate the substrate on which the cell is positioned).

Figure 4B:
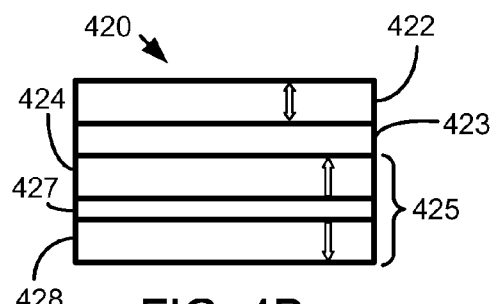

In FIG. 4A, memory cell 410 on substrate 411 has a ferromagnetic free layer 412 having a perpendicular magnetization orientation that is switchable, a ferromagnetic single layer, reference layer 414 having a perpendicular magnetization orientation that is fixed in a direction, with reference layer 414 proximate substrate 411, and barrier layer 413 therebetween. Memory cell 420 of FIG. 4B is similar to memory cell 410 of FIG. 4A, except that memory cell 420 has an unbalanced synthetic antiferromagnetic (SAF) coupled structure as the pinned reference layer. Memory cell 420 has a ferromagnetic free layer 422 having a perpendicular magnetization orientation that is switchable, and an unbalanced synthetic antiferromagnetic (SAF) layer 425 having a perpendicular magnetization orientation that is fixed in a direction, and barrier layer 423 therebetween. SAF layer 425 is composed of a ferromagnetic reference layer 424 having a perpendicular magnetization orientation that is fixed in a direction, a ferromagnetic pinning layer 428 having a perpendicular magnetization orientation that is fixed in a direction opposite to the direction of reference layer 424, and a metallic spacer layer 427, such as Ru or Cu, therebetween. The opposite magnetizations of reference layer 424 and pinning layer 428 provide a net magnetization. The various elements of the following memory cells are the same or similar as those of memory cells 410, 420, unless indicated otherwise.

Figure 4C:
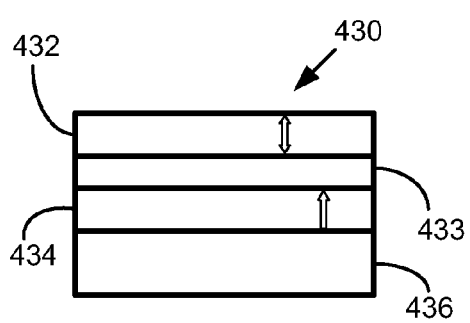
Figure 4D:
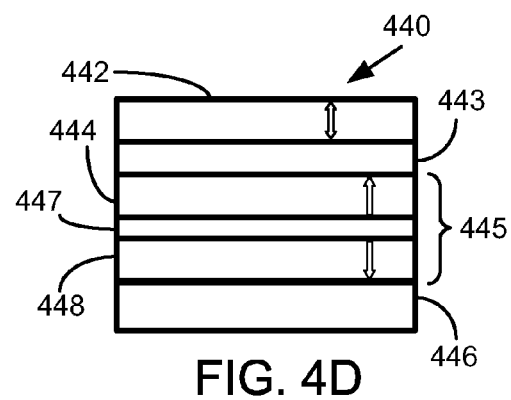

In FIG. 4C, memory cell 430 has a free layer 432 having a switchable perpendicular magnetization orientation, a single layer reference layer 434 having fixed perpendicular magnetization orientation, and barrier layer 433 therebetween. Adjacent reference layer 434 is an antiferromagnetic material (AFM) layer 436. Memory cell 440 of FIG. 4D is similar to memory cell 430 of FIG. 4C, except that memory cell 440 has an unbalanced synthetic antiferromagnetic (SAF) coupled structure as the pinned reference layer. Memory cell 440 has a free layer 442 having a switchable perpendicular magnetization orientation, a SAF layer 445 having fixed perpendicular magnetization, and barrier layer 443 therebetween. SAF layer 445 is composed of a reference layer 444 having a perpendicular magnetization orientation that is fixed in a direction, a pinning layer 448 having a perpendicular magnetization orientation that is fixed in a direction opposite to the direction of reference layer 444, and a metallic spacer layer 447 therebetween. The opposite magnetizations of reference layer 444 and pinning layer 448 provide a net magnetization. Adjacent SAF layer 445, particularly pinning layer 448, is an antiferromagnetic material (AFM) layer 446. AFM layer 446 directly stabilizes the magnetization orientation of pinning layer 448, which stabilizes reference layer 444 via metallic spacer layer 447.

Figure 4E:
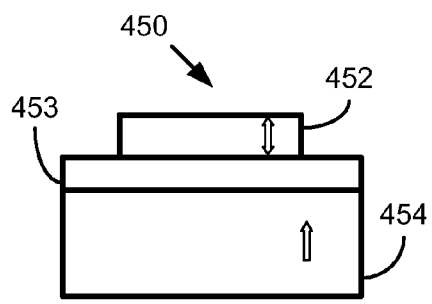
Figure 4F:
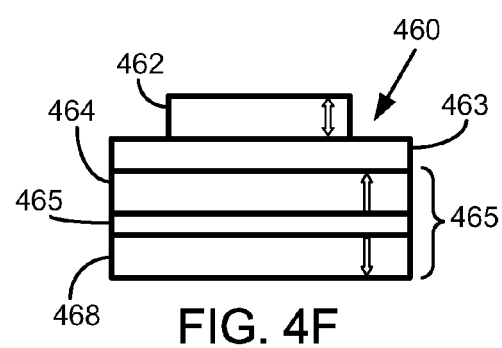

In FIG. 4E, memory cell 450 has a free layer 452 having a switchable perpendicular magnetization orientation, a single layer reference layer 454 having fixed perpendicular magnetization orientation, and barrier layer 453 therebetween. In this embodiment, free layer 452 has surface area less than that of reference layer 454. Free layer 452 is recessed in all directions from reference layer 454; in this embodiment free layer 452 is also recessed in all directions from barrier layer 453. Memory cell 460 of FIG. 4F is similar to memory cell 450 of FIG. 4E, except that memory cell 460 has an unbalanced synthetic antiferromagnetic (SAF) coupled structure as the pinned reference layer. Memory cell 460 has a reduced size or recessed free layer 462 having a switchable perpendicular magnetization orientation, a SAF layer 465 having fixed perpendicular magnetization, and barrier layer 463 therebetween. SAF layer 465 is composed of a reference layer 464 having a perpendicular magnetization orientation that is fixed in a direction, a pinning layer 468 having a perpendicular magnetization orientation that is fixed in a direction opposite to the direction of reference layer 464, and a metallic spacer layer 467 therebetween.

Figure 4G:
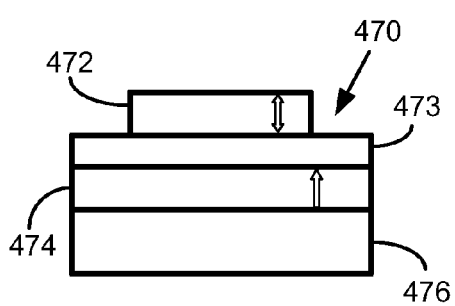
Figure 4H:
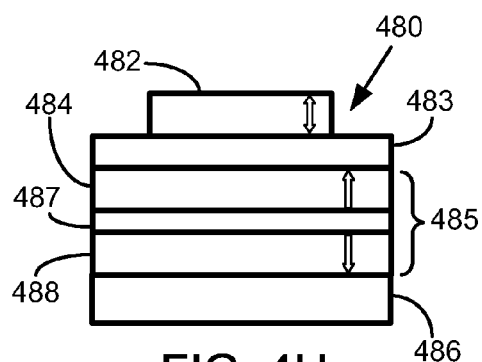

Memory cell 470 of FIG. 4G is similar to memory cell 450 of FIG. 4E and memory cell 480 of FIG. 4H is similar to memory cell 460 of FIG. 4F except that memory cells 470, 480 have a layer of antiferromagnetic material adjacent reference layer 454 and SAF layer 465, respectively. Memory cell 470 of FIG. 4G has a reduced area or recessed free layer 472 having a switchable perpendicular magnetization orientation, a single layer reference layer 474 having fixed perpendicular magnetization orientation, and barrier layer 473 therebetween. Adjacent reference layer 474 is AFM layer 476. Memory cell 480 of FIG. 4H has a reduced size or recessed free layer 482 having a switchable perpendicular magnetization orientation, a SAF layer 485 having fixed perpendicular magnetization, and barrier layer 483 therebetween. SAF layer 485 is composed of a reference layer 484 having a perpendicular magnetization orientation that is fixed in a direction, a pinning layer 488 having a perpendicular magnetization orientation that is fixed in a direction opposite to the direction of reference layer 484, and a metallic spacer layer 487 therebetween. Adjacent SAF layer 485, particularly pinning layer 488, is an antiferromagnetic material (AFM) layer 486. AFM layer 486 directly stabilizes the magnetization orientation of pinning layer 488, which stabilizes reference layer 484 via metallic spacer layer 487.

FIGS. 5A-5H illustrate embodiments of memory cells having a pinned reference layer at the top of the cell (i.e., farthest from the substrate on which the cell is positioned).

In FIG. 5A, memory cell 510, on substrate 511, has a free layer 512 proximate substrate 511 having a switchable perpendicular magnetization orientation, a single layer reference layer 514 having fixed perpendicular magnetization orientation, and barrier layer 513 therebetween. Memory cell 520 of FIG. 5B is similar to memory cell 510 of FIG. 5A, except that memory cell 520 has an unbalanced synthetic antiferromagnetic (SAF) coupled structure as the pinned reference layer. Memory cell 520 has a free layer 522 having a switchable perpendicular magnetization orientation, a SAF layer 525 having fixed perpendicular magnetization, and barrier layer 523 therebetween. SAF layer 525 is composed of a reference layer 524 having a perpendicular magnetization orientation that is fixed in a direction, a pinning layer 528 having a perpendicular magnetization orientation that is fixed in a direction opposite to the direction of reference layer 524, and a metallic spacer layer 527 therebetween.

In FIG. 5C, memory cell 530 has a free layer 532 having a switchable perpendicular magnetization orientation, a single layer reference layer 534 having fixed perpendicular magnetization orientation, and barrier layer 533 therebetween. Adjacent reference layer 534 is an antiferromagnetic material (AFM) layer 536. Memory cell 540 of FIG. 5D is similar to memory cell 530 of FIG. 5C, except that memory cell 540 has an unbalanced synthetic antiferromagnetic (SAF) coupled structure as the pinned reference layer. Memory cell 540 has a free layer 542 having a switchable perpendicular magnetization orientation, a SAF layer 545 having fixed perpendicular magnetization, and barrier layer 543 therebetween. SAF layer 545 is composed of a reference layer 544 having a perpendicular magnetization orientation that is fixed in a direction, a pinning layer 548 having a perpendicular magnetization orientation that is fixed in a direction opposite to the direction of reference layer 544, and a metallic spacer layer 547 therebetween. Adjacent SAF layer 545, particularly reference layer 544, is an AFM layer 546. AFM layer 546 directly stabilizes the magnetization orientation of reference layer 544, which stabilizes pining layer 548 via metallic spacer layer 547.

In FIG. 5E, memory cell 550 has a free layer 552 having a switchable perpendicular magnetization orientation, a single layer reference layer 554 having fixed perpendicular magnetization orientation, and barrier layer 553 therebetween. In this embodiment, reference 554 has surface area less than that of free layer 552. Reference layer 554 is recessed in all directions from free layer 552; in this embodiment reference layer 554 is also recessed in all directions from barrier layer 553. Memory cell 560 of FIG. 5F is similar to memory cell 550 of FIG. 5E, except that memory cell 560 has an unbalanced synthetic antiferromagnetic (SAF) coupled structure as the pinned reference layer. Memory cell 560 has a free layer 562 having a switchable perpendicular magnetization orientation, a reduced size or recessed SAF layer 565 having fixed perpendicular magnetization, and barrier layer 563 therebetween. SAF layer 565 is composed of a reference layer 564 having a perpendicular magnetization orientation that is fixed in a direction, a pinning layer 568 having a perpendicular magnetization orientation that is fixed in a direction opposite to the direction of reference layer 564, and a metallic spacer layer 567 therebetween. In this embodiment, each of layers 564, 567, 568 of SAF layer 565 are recessed.

Memory cell 570 of FIG. 5G is similar to memory cell 550 of FIG. 5E and memory cell 580 of FIG. 5H is similar to memory cell 560 of FIG. 5F except that memory cells 570, 580 have a layer of antiferromagnetic material adjacent reference layer 554 and SAF layer 565, respectively. Memory cell 570 of FIG. 5G has a free layer 572 having a switchable perpendicular magnetization orientation, a reduced area or recessed single layer reference layer 574 having fixed perpendicular magnetization orientation, and barrier layer 573 therebetween. Adjacent reference layer 574 is reduced size or recessed AFM layer 576, having an area reduced in relation to free layer 572 but the same as reference layer 574. Memory cell 580 of FIG. 5H has a free layer 582 having a switchable perpendicular magnetization orientation, a reduced size or recessed SAF layer 585 having fixed perpendicular magnetization, and barrier layer 583 therebetween. SAF layer 585 is composed of a reference layer 584 having a perpendicular magnetization orientation that is fixed in a direction, a pinning layer 588 having a perpendicular magnetization orientation that is fixed in a direction opposite to the direction of reference layer 584, and a metallic spacer layer 587 therebetween. Adjacent SAF layer 585, particularly reference layer 584, is an AFM layer 586. AFM layer 586 directly stabilizes the magnetization orientation of reference layer 584, which stabilizes pining layer 588 via metallic spacer layer 587. In this embodiment, each of layers 564, 567, 568 of SAF layer 565 and AFM layer 586 are recessed.

The following memory cells, in FIGS. 6A-6D, 7A-7D, 8A-8D and 9A-9D, are embodiments of memory cells having a dual cell structure having a ferromagnetic free layer with a switchable perpendicular magnetization orientation bounded on both the top and bottom by a pinned reference layer (either a single reference layer or an SAF layer). In general, the memory cells have a ferromagnetic free layer having a magnetic anisotropy perpendicular to the substrate on which the memory cell is formed, the orientation of the magnetization switchable by spin torque, a first pinned reference layer having a magnetic anisotropy perpendicular to the substrate, the first pinned reference layer positioned between the substrate and the free layer, and a second pinned reference layer having a magnetic anisotropy perpendicular to the substrate, the free layer positioned between the first pinned reference layer and the second pinned reference layer. For embodiments of memory cells having a dual cell structure, the switching current (Ic) is further reduced due to the two pinned reference layers. Because each pinned reference layer affects the switching of the magnetization orientation of the free layer, the spin torque from the first pinned reference layer and the second pinned reference layer are cumulative, thus requiring less total switching current to switch the magnetization orientation of the free layer.

FIGS. 6A-6D illustrate embodiments of memory cells having a dual cell structure with both the top portion and bottom portion pinned with an antiferromagnetic material layer. Each of the embodiments has a free layer with a pinned reference layer (either a single reference layer or an SAF layer) and an AFM layer on each side of the free layer. If the AFM layer is adjacent a SAF layer, the AFM layer directly stabilizes the magnetization orientation of the pinning layer which stabilizes the pinned reference layer via a metallic spacer layer. If the AFM layer is adjacent a single reference layer, the AFM layer directly stabilizes the magnetization orientation of the reference layer.

Figure 6A:
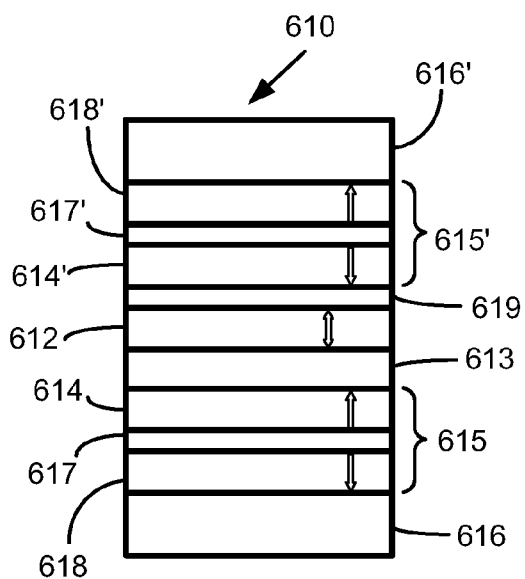
FIGS. 6A-6D are schematic side view diagrams of magnetic tunnel junction memory cells having dual cell structures with both top and bottom pinned reference layers.

In FIG. 6A, memory cell 610 has a free layer 612 having a switchable perpendicular magnetization orientation with a first unbalanced synthetic antiferromagnetic (SAF) layer 615 on a first side and a second unbalanced synthetic antiferromagnetic (SAF) layer 615' on a second side, each with a fixed perpendicular magnetization. First SAF layer 615 is composed of a reference layer 614 having a perpendicular magnetization orientation that is fixed in a direction, a pinning layer 618 having a perpendicular magnetization orientation that is fixed in a direction opposite to the direction of reference layer 614, and a metallic spacer layer 617 therebetween. Second SAF layer 615' is composed of a reference layer 614' having a perpendicular magnetization orientation that is fixed in a direction, a pinning layer 618' having a perpendicular magnetization orientation that is fixed in a direction opposite to the direction of reference layer 614', and a metallic spacer layer 617' therebetween. In some embodiments, second SAF layer 615' is identical to first SAF layer 615. Between free layer 612 and first SAF layer 615 is a barrier layer 613, whereas between free layer 612 and second SAF layer 615' is a nonmetallic layer 619. Adjacent first SAF layer 615, particularly pinned layer 618, is an AFM layer 616. Adjacent second SAF layer 615', particularly pinned layer 618', is a second AFM layer 616'. In this configuration of memory cell 610, barrier layer 613, SAF layer 615 and AFM layer 616 are between free layer 612 and the substrate on which memory cell 610 is formed, and nonmetallic layer 619, second SAF layer 615' and second AFM layer 616' are above free layer 612.

Figure 6B:
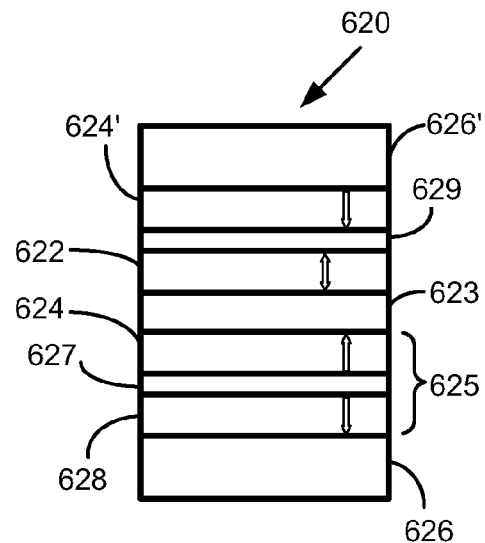

Memory cell 620 of FIG. 6B is similar to memory cell 610 of FIG. 6A except that second SAF layer 615' above free layer 612 is replaced with a single layer pinned reference layer. Memory cell 620 has a free layer 622 having a switchable perpendicular magnetization orientation with an SAF layer 625 with a fixed perpendicular magnetization between free layer 622 and the substrate on which memory cell 620 is formed. SAF layer 625 is composed of a reference layer 624 having a perpendicular magnetization orientation that is fixed in a direction, a pinning layer 628 having a perpendicular magnetization orientation that is fixed in a direction opposite to the direction of reference layer 624, and a metallic spacer layer 627 therebetween. Adjacent SAF layer 625, particularly pinned layer 628, is an AFM layer 626. Barrier layer 623 is between SAF layer 625 and free layer 622. On the other side of free layer 622 is a single layer pinned reference layer 624' with a second AFM layer 626'. A nonmetallic layer 629 is between free layer 622 and reference layer 624'. In this configuration of memory cell 620, barrier layer 623, SAF layer 625 and AFM layer 626 are between free layer 622 and the substrate on which memory cell 620 is formed, and nonmetallic layer 629, reference layer 624' and second AFM layer 626' are above free layer 622.

Figure 6C:
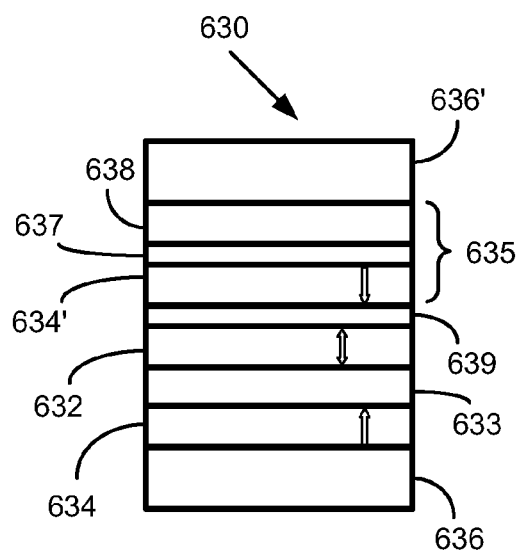

Memory cell 630 of FIG. 6C is similar to memory cell 620 of FIG. 6B except that the SAF layer is above the free layer and the single layer pinned reference layer is below the free layer. Memory cell 630 has a free layer 632 having a switchable perpendicular magnetization orientation with a single layer pinned reference layer 634 with a fixed perpendicular magnetization between free layer 632 and the substrate on which memory cell 630 is formed. Adjacent reference layer 634 is an AFM layer 636. A barrier layer 633 is between reference layer 634 and free layer 632. On the other side of free layer 632 is an SAF layer 635 with a fixed perpendicular magnetization. SAF layer 635 is composed of a reference layer 634' having a perpendicular magnetization orientation that is fixed in a direction, a pinning layer 638 having a perpendicular magnetization orientation that is fixed in a direction opposite to the direction of reference layer 634', and a metallic spacer layer 637 therebetween. Adjacent SAF layer 635, particularly pinned layer 638, is a second AFM layer 636'. A nonmetallic layer 639 is between free layer 632 and SAF layer 635. In this configuration of memory cell 630, barrier layer 623, reference layer 634 and AFM layer 636 are between free layer 632 and the substrate on which memory cell 630 is formed, and nonmetallic layer 639, SAF layer 635 and second AFM layer 636' are above free layer 632.

Figure 6D:
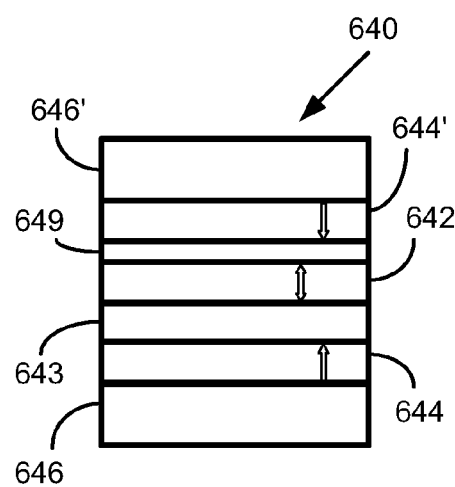

Memory cell 640 of FIG. 6D is similar to each of memory cell 610 of FIG. 6A, memory cell 620 of FIG. 6B and memory cell 630 of FIG. 6C except that a single layer pinned reference layer is both above and below the free layer in memory cell 640 of FIG. 6D. Memory cell 640 has a free layer 642 having a switchable perpendicular magnetization orientation with a single layer pinned reference layer 644 with a fixed perpendicular magnetization on a first side of free layer 642 and a second single layer pinned reference layer 644' on the opposite side of free layer 642. Adjacent each reference layer 644, 644' is an AFM layer 646, 646', respectively. A barrier layer 643 is between reference layer 644 and free layer 642, and a nonmetallic layer 649 is between free layer 642 and second reference layer 644'. In this configuration of memory cell 640, barrier layer 643 is positioned between free layer 642 and the substrate on which memory cell 640 is formed, and nonmetallic layer 649 is above free layer 642.

FIGS. 7A-7D illustrate embodiments of memory cells having a dual cell structure with only the top portion pinned with an antiferromagnetic material layer. Each of the embodiments has a free layer with a pinned reference layer (either a single reference layer or an SAF layer) on each side of the free layer but with an AFM layer only above the free layer. If the AFM layer is adjacent a SAF layer, the AFM layer directly stabilizes the magnetization orientation of the pinning layer which stabilizes the pinned reference layer via a metallic spacer layer. If the AFM layer is adjacent a single reference layer, the AFM layer directly stabilizes the magnetization orientation of the reference layer.

Figure 7A:
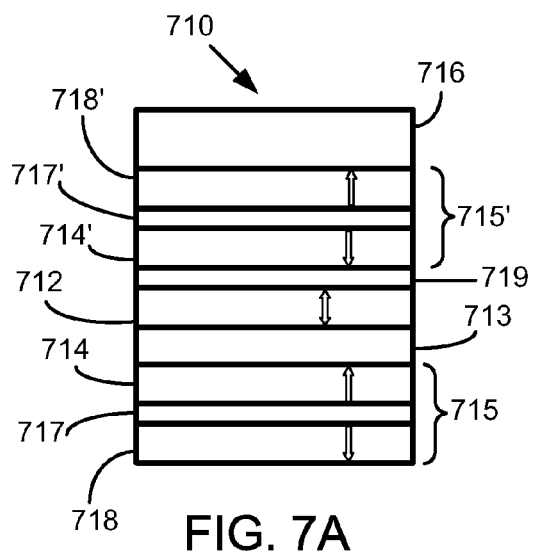
FIGS. 7A-7D are schematic side view diagrams of magnetic tunnel junction memory cells having dual cell structures with top pinned reference layers.

In FIG. 7A, memory cell 710 has a free layer 712 having a switchable perpendicular magnetization orientation with a first unbalanced synthetic antiferromagnetic (SAF) layer 715 on a first side and a second unbalanced synthetic antiferromagnetic (SAF) layer 715' on a second side, each with a fixed perpendicular magnetization. First SAF layer 715 is composed of a reference layer 714 having a perpendicular magnetization orientation that is fixed in a direction, a pinning layer 718 having a perpendicular magnetization orientation that is fixed in a direction opposite to the direction of reference layer 714, and a metallic spacer layer 717 therebetween. Second SAF layer 715' is composed of a reference layer 714' having a perpendicular magnetization orientation that is fixed in a direction, a pinning layer 718' having a perpendicular magnetization orientation that is fixed in a direction opposite to the direction of reference layer 714', and a metallic spacer layer 717' therebetween. In some embodiments, second SAF layer 715' is identical to first SAF layer 715. Between free layer 712 and first SAF layer 715 is a barrier layer 713, whereas between free layer 712 and second SAF layer 715' is a nonmetallic layer 719. Adjacent second SAF layer 715', particularly pinned layer 718', is an AFM layer 716'. In this configuration of memory cell 710, barrier layer 713 and SAF layer 715 are between free layer 712 and the substrate on which memory cell 710 is formed, and nonmetallic layer 719, second SAF layer 715' and AFM layer 716 are above free layer 712.

Figure 7B:
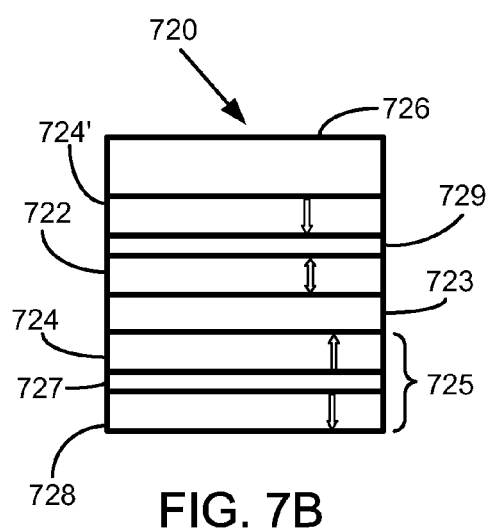

Memory cell 720 of FIG. 7B is similar to memory cell 710 of FIG. 7A except that second SAF layer 715' above free layer 712 is replaced with a single layer pinned reference layer. Memory cell 720 has a free layer 722 having a switchable perpendicular magnetization orientation with an SAF layer 725 with a fixed perpendicular magnetization between free layer 722 and the substrate on which memory cell 720 is formed. SAF layer 725 is composed of a reference layer 724 having a perpendicular magnetization orientation that is fixed in a direction, a pinning layer 728 having a perpendicular magnetization orientation that is fixed in a direction opposite to the direction of reference layer 724, and a metallic spacer layer 727 therebetween. Barrier layer 723 is between SAF layer 725 and free layer 722. On the other side of free layer 722 is a single layer pinned reference layer 724' with an AFM layer 726. A nonmetallic layer 729 is between free layer 722 and reference layer 724'. In this configuration of memory cell 720, barrier layer 723 and SAF layer 725 are between free layer 722 and the substrate on which memory cell 720 is formed, and nonmetallic layer 729, reference layer 724' and AFM layer 726 are above free layer 722.

Figure 7C:
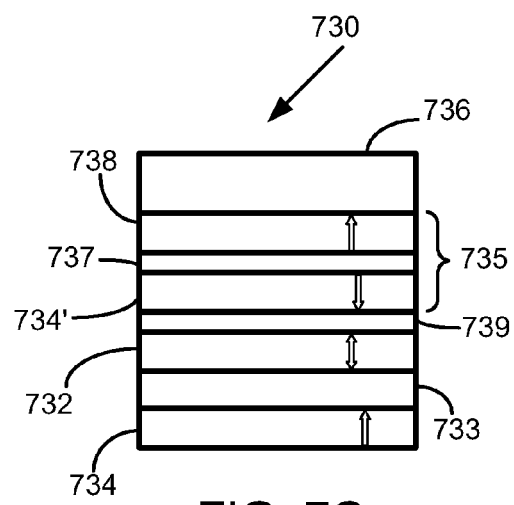

Memory cell 730 of FIG. 7C is similar to memory cell 720 of FIG. 7B except that the SAF layer is above the free layer and the single layer pinned reference layer is below the free layer. Memory cell 730 has a free layer 732 having a switchable perpendicular magnetization orientation with a single layer pinned reference layer 734 with a fixed perpendicular magnetization between free layer 732 and the substrate on which memory cell 730 is formed. A barrier layer 733 is between reference layer 734 and free layer 732. On the other side of free layer 732 is an SAF layer 735 with a fixed perpendicular magnetization. SAF layer 735 is composed of a reference layer 734' having a perpendicular magnetization orientation that is fixed in a direction, a pinning layer 738 having a perpendicular magnetization orientation that is fixed in a direction opposite to the direction of reference layer 734', and a metallic spacer layer 737 therebetween. Adjacent SAF layer 735, particularly pinned layer 738, is an AFM layer 736. A nonmetallic layer 739 is between free layer 732 and SAF layer 735. In this configuration of memory cell 730, barrier layer 723 and reference layer 734 are between free layer 732 and the substrate on which memory cell 730 is formed, and nonmetallic layer 739, SAF layer 735 and AFM layer 736 are above free layer 732.

Figure 7D:
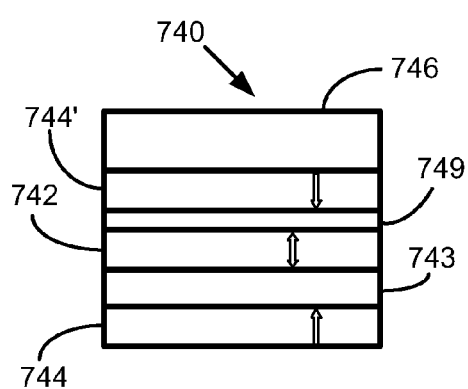

Memory cell 740 of FIG. 7D is similar to each of memory cell 710 of FIG. 7A, memory cell 720 of FIG. 7B and memory cell 730 of FIG. 7C except that a single layer pinned reference layer is both above and below the free layer in memory cell 740 of FIG. 7D. Memory cell 740 has a free layer 742 having a switchable perpendicular magnetization orientation with a single layer pinned reference layer 744 with a fixed perpendicular magnetization on a first side of free layer 742 and a second single layer pinned reference layer 744' on the opposite side of free layer 742. Adjacent reference layer 744' is an AFM layer 746. A barrier layer 743 is between reference layer 744 and free layer 742, and a nonmetallic layer 749 is between free layer 742 and second reference layer 744'. In this configuration of memory cell 740, barrier layer 743 is positioned between free layer 742 and the substrate on which memory cell 740 is formed, and nonmetallic layer 749 is above free layer 742.

FIGS. 8A-8D illustrate embodiments of memory cells having a dual cell structure with only the lower portion pinned with an antiferromagnetic material layer. Each of the embodiments has a free layer with a pinned reference layer (either a single reference layer or an SAF layer) on each side of the free layer but with an AFM layer only between the free layer and the substrate on which the memory cell is present. If the AFM layer is adjacent a SAF layer, the AFM layer directly stabilizes the magnetization orientation of the pinning layer which stabilizes the pinned reference layer via a metallic spacer layer. If the AFM layer is adjacent a single reference layer, the AFM layer directly stabilizes the magnetization orientation of the reference layer.

Figure 8A:
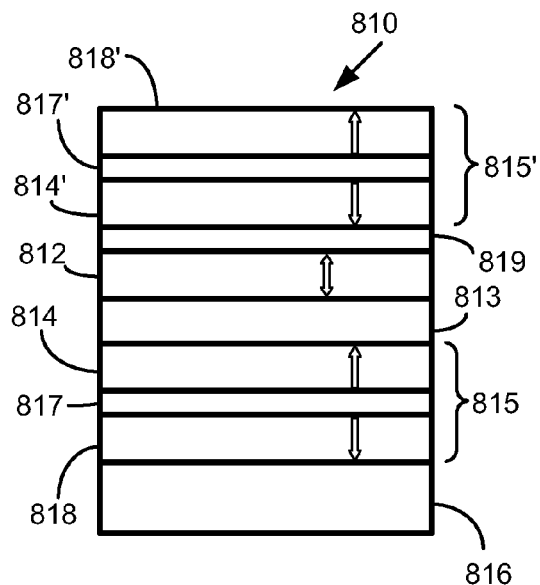
FIGS. 8A-8D are schematic side view diagrams of magnetic tunnel junction memory cells having dual cell structures with bottom pinned reference layers.

In FIG. 8A, memory cell 810 has a free layer 812 having a switchable perpendicular magnetization orientation with a first unbalanced synthetic antiferromagnetic (SAF) layer 815 on a first side and a second unbalanced synthetic antiferromagnetic (SAF) layer 815' on a second side of free layer 812, each with a fixed perpendicular magnetization. First SAF layer 815 is composed of a reference layer 814 having a perpendicular magnetization orientation that is fixed in a direction, a pinning layer 818 having a perpendicular magnetization orientation that is fixed in a direction opposite to the direction of reference layer 814, and a metallic spacer layer 817 therebetween. Adjacent SAF layer 815, particularly pinned layer 818, is an AFM layer 816. Second SAF layer 815' is composed of a reference layer 814' having a perpendicular magnetization orientation that is fixed in a direction, a pinning layer 818' having a perpendicular magnetization orientation that is fixed in a direction opposite to the direction of reference layer 814', and a metallic spacer layer 817' therebetween. In some embodiments, second SAF layer 815' is identical to first SAF layer 815. Between free layer 812 and first SAF layer 815 is a barrier layer 813, whereas between free layer 812 and second SAF layer 815' is a nonmetallic layer 819. In this configuration of memory cell 810, barrier layer 813, SAF layer 815 and AFM layer 816 are between free layer 812 and the substrate on which memory cell 810 is formed, and nonmetallic layer 819 and second SAF layer 815' are above free layer 812.

Figure 8B:
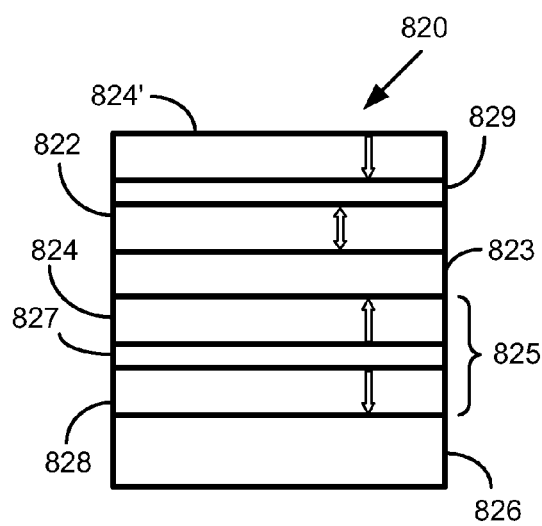

Memory cell 820 of FIG. 8B is similar to memory cell 810 of FIG. 8A except that the SAF layer 815' above free layer 812 is replaced with a single layer pinned reference layer. Memory cell 820 has a free layer 822 having a switchable perpendicular magnetization orientation with an SAF layer 825 with a fixed perpendicular magnetization between free layer 822 and the substrate on which memory cell 820 is formed. SAF layer 825 is composed of a reference layer 824 having a perpendicular magnetization orientation that is fixed in a direction, a pinning layer 828 having a perpendicular magnetization orientation that is fixed in a direction opposite to the direction of reference layer 824, and a metallic spacer layer 827 therebetween. Barrier layer 823 is between SAF layer 825 and free layer 822. Adjacent SAF layer 825, particularly pinned layer 828, is an AFM layer 826. On the other side of free layer 822 is a single layer pinned reference layer 824'. A nonmetallic layer 829 is between free layer 822 and reference layer 824'. In this configuration of memory cell 820, barrier layer 823, SAF layer 825 and AFM layer 826 are between free layer 822 and the substrate on which memory cell 820 is formed, and nonmetallic layer 829 and reference layer 824' are above free layer 822.

Figure 8C:
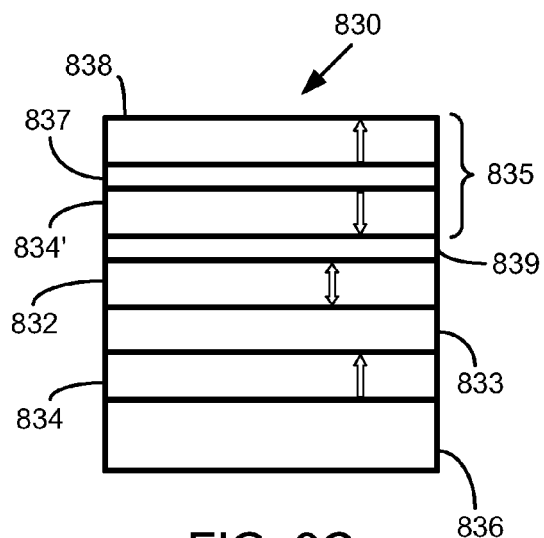

Memory cell 830 of FIG. 8C is similar to memory cell 820 of FIG. 8B except that the SAF layer is above the free layer and the single layer pinned reference layer is below the free layer. Memory cell 830 has a free layer 832 having a switchable perpendicular magnetization orientation with a single layer pinned reference layer 834 with a fixed perpendicular magnetization between free layer 832 and the substrate on which memory cell 830 is formed. Adjacent reference layer 834 is an AFM layer 836. A barrier layer 833 is between reference layer 834 and free layer 832. On the other side of free layer 832 is an SAF layer 835 with a fixed perpendicular magnetization. SAF layer 835 is composed of a reference layer 834' having a perpendicular magnetization orientation that is fixed in a direction, a pinning layer 838 having a perpendicular magnetization orientation that is fixed in a direction opposite to the direction of reference layer 834', and a metallic spacer layer 837 therebetween. A nonmetallic layer 839 is between free layer 832 and SAF layer 835. In this configuration of memory cell 830, barrier layer 823, reference layer 834 and AFM layer 836 are between free layer 832 and the substrate on which memory cell 830 is formed, and nonmetallic layer 839 and SAF layer 835 are above free layer 832.

Figure 8D:
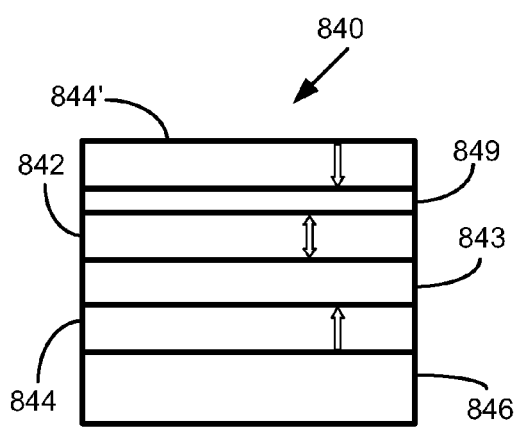

Memory cell 840 of FIG. 8D is similar to each of memory cell 810 of FIG. 8A, memory cell 820 of FIG. 8B and memory cell 830 of FIG. 8C except that a single layer pinned reference layer is both above and below the free layer in memory cell 840 of FIG. 8D. Memory cell 840 has a free layer 842 having a switchable perpendicular magnetization orientation with a single layer pinned reference layer 844 with a fixed perpendicular magnetization on a first side of free layer 842 and a second single layer pinned reference layer 844' on the opposite side of free layer 842. Adjacent reference layer 844 is an AFM layer 846. A barrier layer 843 is between reference layer 844 and free layer 842, and a nonmetallic layer 849 is between free layer 842 and second reference layer 844'. In this configuration of memory cell 840, barrier layer 843 is positioned between free layer 842 and the substrate on which memory cell 840 is formed, and nonmetallic layer 849 is above free layer 842.

FIGS. 9A-9D illustrate embodiments of memory cells having a dual cell structure with no portion pinned by an antiferromagnetic material layer. Each of the embodiments has a free layer with a pinned reference layer (either a single reference layer or an SAF layer) on each side of the free layer.

Figure 9A:
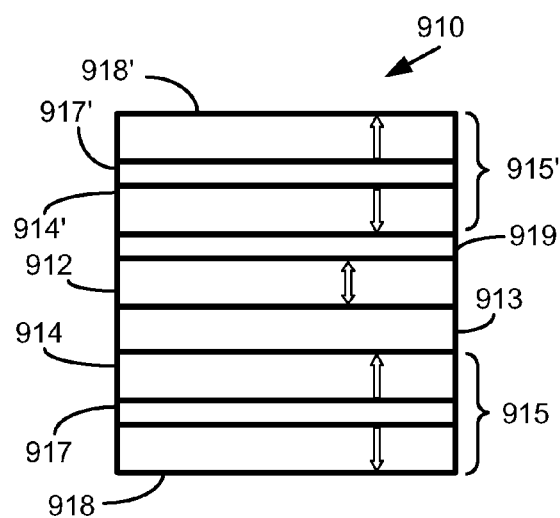
FIGS. 9A-9D are schematic side view diagrams of magnetic tunnel junction memory cells having dual cell structures with no antiferromagnetic layers.

In FIG. 9A, memory cell 910 has a free layer 912 having a switchable perpendicular magnetization orientation with a first unbalanced synthetic antiferromagnetic (SAF) layer 915 on a first side and a second unbalanced synthetic antiferromagnetic (SAF) layer 915' on a second side of free layer 912, each with a fixed perpendicular magnetization. First SAF layer 915 is composed of a reference layer 914 having a perpendicular magnetization orientation that is fixed in a direction, a pinning layer 918 having a perpendicular magnetization orientation that is fixed in a direction opposite to the direction of reference layer 914, and a metallic spacer layer 917 therebetween. Second SAF layer 915' is composed of a reference layer 914' having a perpendicular magnetization orientation that is fixed in a direction, a pinning layer 918' having a perpendicular magnetization orientation that is fixed in a direction opposite to the direction of reference layer 914', and a metallic spacer layer 917' therebetween. In some embodiments, second SAF layer 915' is identical to first SAF layer 915. Between free layer 912 and first SAF layer 915 is a barrier layer 913, whereas between free layer 912 and second SAF layer 915' is a nonmetallic layer 919. In this configuration of memory cell 910, barrier layer 913 and SAF layer 915 are between free layer 912 and the substrate on which memory cell 910 is formed, and nonmetallic layer 919 and second SAF layer 915' are above free layer 912.

Memory cell 920 of FIG. 8B is similar to memory cell 910 of FIG. 8A except that the SAF layer 915' above free layer 912 is replaced with a single layer pinned reference layer. Memory cell 920 has a free layer 922 having a switchable perpendicular magnetization orientation with an SAF layer 925 with a fixed perpendicular magnetization between free layer 922 and the substrate on which memory cell 920 is formed. SAF layer 925 is composed of a reference layer 924 having a perpendicular magnetization orientation that is fixed in a direction, a pinning layer 928 having a perpendicular magnetization orientation that is fixed in a direction opposite to the direction of reference layer 924, and a metallic spacer layer 927 therebetween. Barrier layer 923 is between SAF layer 925 and free layer 922. On the other side of free layer 922 is a single layer pinned reference layer 924'. A nonmetallic layer 929 is between free layer 922 and reference layer 924'. In this configuration of memory cell 920, barrier layer 923 and SAF layer 925 are between free layer 922 and the substrate on which memory cell 920 is formed, and nonmetallic layer 929 and reference layer 924' are above free layer 922.

Figure 9B:
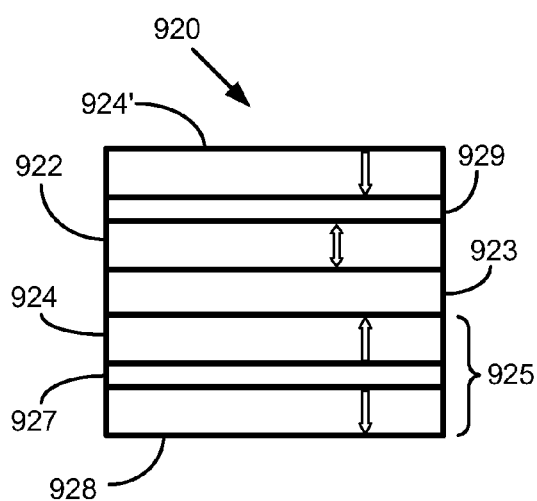
Figure 9C:
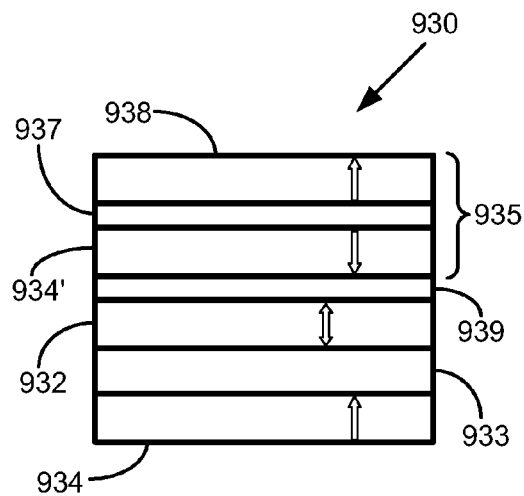

Memory cell 930 of FIG. 9C is similar to memory cell 920 of FIG. 9B except that the SAF layer is above the free layer and the single layer pinned reference layer is below the free layer. Memory cell 930 has a free layer 932 having a switchable perpendicular magnetization orientation with a single layer pinned reference layer 934 with a fixed perpendicular magnetization between free layer 932 and the substrate on which memory cell 930 is formed. A barrier layer 933 is between reference layer 934 and free layer 932. On the other side of free layer 932 is an SAF layer 935 with a fixed perpendicular magnetization. SAF layer 935 is composed of a reference layer 934' having a perpendicular magnetization orientation that is fixed in a direction, a pinning layer 938 having a perpendicular magnetization orientation that is fixed in a direction opposite to the direction of reference layer 934', and a metallic spacer layer 937 therebetween. A nonmetallic layer 939 is between free layer 932 and SAF layer 935. In this configuration of memory cell 930, barrier layer 923 and reference layer 934 are between free layer 932 and the substrate on which memory cell 930 is formed, and nonmetallic layer 939 and SAF layer 935 are above free layer 932.

Figure 9D:
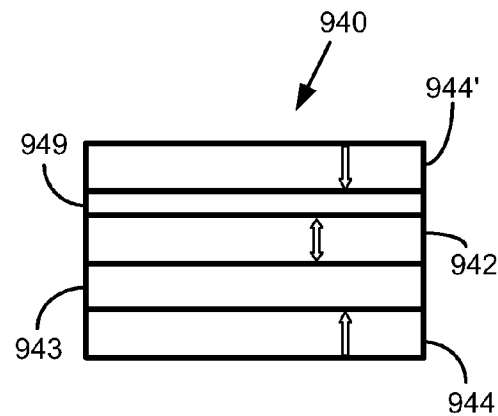

Memory cell 940 of FIG. 9D is similar to each of memory cell 910 of FIG. 9A, memory cell 920 of FIG. 9B and memory cell 930 of FIG. 9C except that a single layer pinned reference layer is both above and below the free layer in memory cell 940 of FIG. 9D. Memory cell 940 has a free layer 942 having a switchable perpendicular magnetization orientation with a single layer pinned reference layer 944 with a fixed perpendicular magnetization on a first side of free layer 942 and a second single layer pinned reference layer 944' on the opposite side of free layer 942. A barrier layer 943 is between reference layer 944 and free layer 942, and a nonmetallic layer 949 is between free layer 942 and second reference layer 944'. In this configuration of memory cell 940, barrier layer 943 is positioned between free layer 942 and the substrate on which memory cell 940 is formed, and nonmetallic layer 949 is above free layer 942.

The following memory cells of FIGS. 10A-10D are embodiments of dual cell memory cells having a reduced area for at least one layer. In some embodiments, the second pinned reference layer has an area less than the area of the free layer. In other embodiments, both the second pinned reference and the free layer have areas less than the area of the first pinned layer. For embodiments of memory cells having a reduced area for at least one of the layers, the current passing through the memory cell is concentrated as it passes from one layer to the other, due to the smaller area, thus increasing the current density and further reducing the switching current (Ic) needed.

Figure 10A:
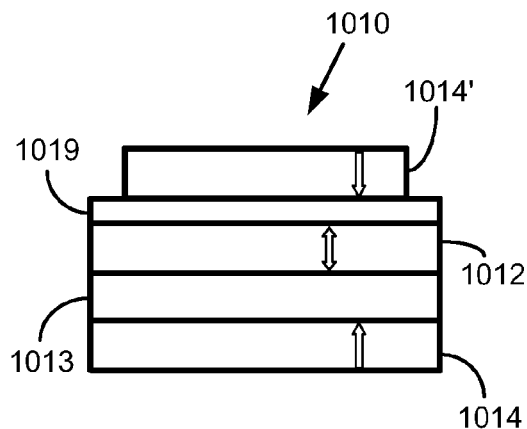
FIGS. 10A-10D are schematic side view diagrams of magnetic tunnel junction memory cells having dual cell structures with at least one layer having a reduced size.

In FIG. 10A, memory cell 1010 has a free layer 1012 having a switchable perpendicular magnetization orientation with a first pinned reference layer 1014 on a first side and a second pinned reference layer 1014' on a second side of free layer 1012, each with a fixed perpendicular magnetization. Either or both pinned reference layers 1014, 1014' may be a pinned single layer reference layer or an unbalanced synthetic antiferromagnetic (SAF) layer. Adjacent either or both pinned reference layer 1014, 1014' may be an antiferromagnetic (AFM) layer. Between free layer 1012 and first reference layer 1014 is a barrier layer 1013, whereas between free layer 1012 and second reference layer 1014' is a nonmetallic layer 1019. In this embodiment, second pinned reference layer 1014' has surface area less than that of free layer 1012 and of first pinned reference layer 1014. Second reference layer 1014' is recessed in all directions from free layer 1012; in this embodiment second reference layer 1014' is also recessed in all directions from nonmetallic layer 1019.

Figure 10B:
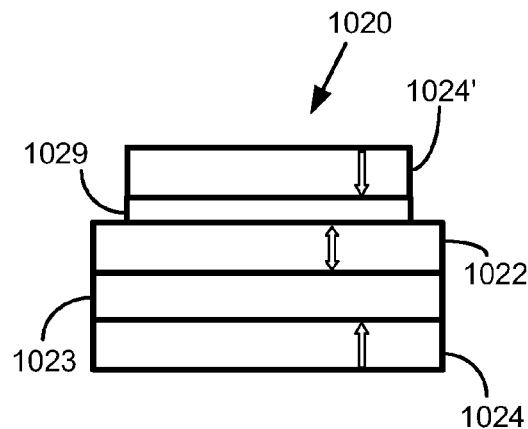

Memory cell 1020 of FIG. 10B is similar to memory cell 1010 of FIG. 10A except that the nonmetallic layer of memory cell 1020 also has a surface area less than that of the free layer. Memory cell 1020 has a free layer 1022 having a switchable perpendicular magnetization orientation with a first pinned reference layer 1024 on a first side and a second pinned reference layer 1024' on a second side of free layer 1022, each with a fixed perpendicular magnetization. Either or both pinned reference layers 1024, 1024' may be a pinned single layer reference layer or an unbalanced synthetic antiferromagnetic (SAF) layer. Adjacent either or both pinned reference layer 1024, 1024' may be an antiferromagnetic (AFM) layer. Between free layer 1022 and first reference layer 1024 is a barrier layer 1023, and between free layer 1022 and second reference layer 1024' is a nonmetallic layer 1029. In this embodiment, both second pinned reference layer 1024' and nonmetallic layer 1029 have a surface area less than that of free layer 1022 and of first pinned reference layer 1024. Second reference layer 1024' and nonmetallic layer 1029 are recessed in all directions from free layer 1022.

Figure 10C:
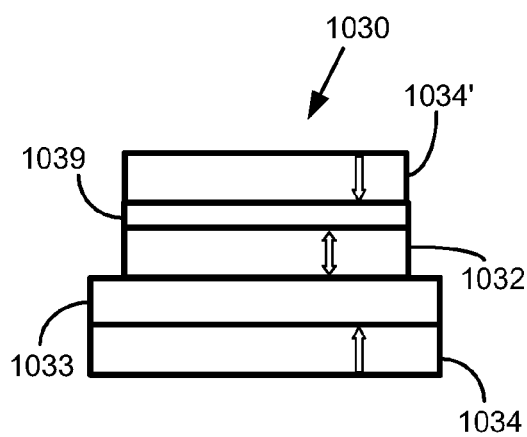
Figure 10D:
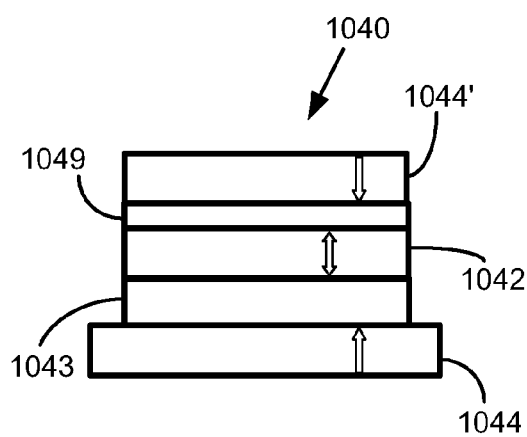

Memory cell 1030 of FIG. 10C is similar to memory cell 1010 of FIG. 10A and memory cell 1020 of FIG. 10B except that the free layer has a surface area less than that of the first pinned reference layer. Memory cell 1030 has a free layer 1032 having a switchable perpendicular magnetization orientation with a first pinned reference layer 1034 on a first side and a second pinned reference layer 1034' on a second side of free layer 1032, each with a fixed perpendicular magnetization. Either or both pinned reference layers 1034, 1034' may be a pinned single layer reference layer or an unbalanced synthetic antiferromagnetic (SAF) layer. Adjacent either or both pinned reference layer 1034, 1034' may be an antiferromagnetic (AFM) layer. Between free layer 1032 and first reference layer 1034 is a barrier layer 1033, and between free layer 1032 and second reference layer 1034' is a nonmetallic layer 1039. In this embodiment, all of second pinned reference layer 1034', nonmetallic layer 1039 and free layer 1032 have a surface area less than that of first pinned reference layer. Each of second pinned reference layer 1034', nonmetallic layer 1039 and free layer 1032 is recessed in all directions from first pinned reference layer 1034.

Similarly, memory cell 1040 of FIG. 10C is similar to memory cell 1010 of FIG. 10A, memory cell 1020 of FIG. 10B and memory cell 1030 of FIG. 10C except that the barrier layer proximate the free layer also has a surface area less than that of the first pinned reference layer. Memory cell 1040 has a free layer 1042 having a switchable perpendicular magnetization orientation with a first pinned reference layer 1044 on a first side and a second pinned reference layer 1044' on a second side of free layer 1042, each with a fixed perpendicular magnetization. Either or both pinned reference layers 1044, 1044' may be a pinned single layer reference layer or an unbalanced synthetic antiferromagnetic (SAF) layer. Adjacent either or both pinned reference layer 1044, 1044' may be an antiferromagnetic (AFM) layer. Between free layer 1042 and first reference layer 1044 is a barrier layer 1043, and between free layer 1042 and second reference layer 1044' is a nonmetallic layer 1049. In this embodiment, all of second pinned reference layer 1044', nonmetallic layer 1049, free layer 1042 and barrier layer 1043 have a surface area less than that of first pinned reference layer 1044. Each of second pinned reference layer 1044', nonmetallic layer 1049, free layer 1042 and barrier layer 1043 is recessed in all directions from first pinned reference layer 1044.

Each of the exemplary spin torque memory cells described above have magnetic anisotropy of their associated ferromagnetic layers aligned perpendicular to the plane on which the cell is formed (i.e., the wafer plane). Although the figures illustrate a direction for the magnetization orientation of the reference or pinned layers, it should be understood that the magnetization orientation could be in the opposite direction, as long as it remains perpendicular or out-of-plane. Due to the specific memory cell construction, switching current of the cell (i.e., from high to low data state and from low to high data state) is reduced while maintaining sufficient thermal stability and achieving high area density with more tolerance to process variations.

Each of the memory cells includes a ferromagnetic free layer with perpendicular anisotropy, and at least one ferromagnetic reference layers (either a single reference layer or a tri-layer unbalanced synthetic antiferromagnetic (SAF) coupled structure) also with a perpendicular anisotropy. In some embodiments (e.g., the embodiments of FIGS. 6A-6D, 7A-7D, 8A-8D and 9A-9D) the memory cells include two ferromagnetic reference layers (either a single reference layer or a tri-layer unbalanced synthetic antiferromagnetic (SAF) coupled structure). Although the illustrated embodiments of FIGS. 6A-6D, 7A-7D, 8A-8D and 9A-9D have shown and described the tunneling barrier layer as being between the free layer and the substrate on which the memory cell is formed and the nonmagnetic layer as being above the free layer, the relative position of these layers may be switched, so that the nonmagnetic layer is between the free layer and the substrate and the barrier layer is above the free layer.

Each of the free layer, pinned reference layer (and its various layers, as appropriate), and AFM pinning layer (if present) can be any of the many choices with perpendicular magnetic anisotropy as described in reference to FIGS. 1A and 1B and those described below.

Examples of particularly useful materials for the ferromagnetic free layer include ferromagnetic (FM) materials such as Fe, Co or Ni and alloys thereof, such as NiFe and CoFe. Ternary alloys, such as CoFeB, may be particularly useful because of their lower moment and high polarization ratio. Cobalt (Co) is particularly suitable for free layers with perpendicular magnetic anisotropy. Examples of particularly useful material for the single layer pinned reference layer (e.g., reference layer 624' of FIG. 6B) and for the reference layer of the SAF layer (e.g., reference layer 624 of SAF layer 625 in FIG. 6B, etc.) include ferromagnetic materials including FeCo materials and mixtures, such as TbFeCo, CoFeB—TbFeCo, and CoFeB—NiFe. Examples of particularly useful materials for the pinned layer of the SAF layer (e.g., pinned layer 628 of SAF layer 625 in FIG. 6B, etc.) include ferromagnetic materials including FeCo materials, such as TbFeCo, GdFeCo, and CoFe. Ru and Cu are suitable metallic materials for the metallic spacer layer in the SAF layer (e.g., spacer layer 627 of SAF layer 625 in FIG. 6B). Examples of suitable materials for the barrier layer (e.g., barrier layer 623 of FIG. 6B) between the free layer and the lower pinned reference layer include electrically insulating material such as, for example, oxide materials (e.g., $Al_2O_3$, $TiO_x$, $MgO_x$). Examples of suitable materials for the nonmagnetic layer (e.g., layer 629 of FIG. 6B) include nonmagnetic metal materials, such as Cu, or tunnel barrier materials (e.g., oxides) with different properties than the material used for the barrier layer in the same cell.

The previous paragraph has provided examples of various materials that can have perpendicular magnetic anisotropy.

There are many configurations of these and other materials that provide perpendicular magnetic anisotropy, including (1) a single layer of the ferromagnetic material (FM); (2) a ferromagnetic/nonmetallic (FM/NM) multilayer; (3) a FM/FM multilayer; (4) ferromagnetic alloys with particular crystal phase and texture, and (5) heavy rare earth-transition metal alloys. One particular example of a FM/NM multilayer is Co/Pt multilayer. An example of a FM/FM multilayer is Co/Ni multilayer. An example of a ferromagnetic alloy with particular crystal phase and texture is a CoPtx alloy with hcp crystal structure and a c-axis (easy axis) perpendicular to the film plane. Another example is FePt with L10 structure and a c-axis perpendicular to the film plane. The same L10 FePt can be made in a FePt multilayer fashion, such as Cr/Pt/FePt. Examples of heavy rare earth-transition metal alloys include TbCoFe and GdCoFe.

Any or all of these layers (i.e., the free layer, pinned reference layer (and its various layers, as appropriate), and AFM pinning layer (if present) may be a composite double or multilayer layer having next to the tunnel barrier layer a dusting layer (having high spin polarization) and another sublayer providing the necessary perpendicular anisotropy. The dusting layer and sublayer(s) tightly coupled together through exchange coupling.

The various structures of this disclosure (e.g., memory cells, memory arrays, etc.) may be made by thin film techniques such as chemical vapor deposition (CVD), physical vapor deposition (PVD), sputter deposition, and atomic layer deposition (ALD).

Thus, embodiments of the ST-RAM CELLS WITH PERPENDICULAR ANISOTROPY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

The use of numerical identifiers, such as "first", "second", etc. in the claims that follow is for purposes of identification and providing antecedent basis. Unless content clearly dictates otherwise, it should not be implied that a numerical identifier refers to the number of such elements required to be present in a device, system or apparatus. For example, if a device includes a first layer, it should not be implied that a second layer is required in that device.

What is claimed is:

1. A magnetic memory cell on a substrate, the memory cell comprising a ferromagnetic free layer, a first pinned reference layer and a second pinned reference layer, each having a magnetic anisotropy perpendicular to the substrate, the first and second pinned reference layer are unbalanced synthetic antiferromagnetic (SAF) coupled structures each unbalanced synthetic antiferromagnetic (SAF) coupled structure comprising two ferromagnetic layers separated by a metallic spacer and the two ferromagnetic layers have opposing magnetizations of unequal magnitude resulting in a net magnetization, the free layer between the first pinned reference layer and the second pinned reference layer and having a magnetization orientation perpendicular to the substrate and switchable by spin torque from a first orientation to an opposite second orientation, the magnetization of the free layer coupled to each of the first pinned reference layer and the second pinned reference layer and a first nonmagnetic and insulating barrier layer positioned between the free layer and the first pinned reference layer and a second nonmagnetic and insulating barrier layer positioned between the free layer and the second pinned reference layer.

2. A magnetic memory cell on a substrate, the memory cell comprising:
   a ferromagnetic free layer having a magnetic anisotropy and a magnetization perpendicular to the substrate, the magnetization switchable by spin torque;
   a first pinned reference layer having a magnetic anisotropy and a magnetization pinned perpendicular to the substrate, the first pinned reference layer positioned between the substrate and the free layer;
   a first nonmagnetic and insulating barrier layer positioned between the free layer and the first pinned reference layer;
   a second pinned reference layer having a magnetic anisotropy and magnetization pinned perpendicular to the substrate, the free layer positioned between the first pinned reference layer and the second pinned reference layer; and
   a second nonmagnetic and insulating barrier layer positioned between the free layer and the second pinned reference layer;
   wherein the first pinned reference layer and the second pinned reference layer are unbalanced synthetic antiferromagnetic (SAF) coupled structures, each unbalanced synthetic antiferromagnetic (SAF) coupled structure comprising two ferromagnetic layers separated by a metallic spacer and the two ferromagnetic layers have opposing magnetizations of unequal magnitude resulting in a net magnetization and the free layer has a free layer interface area and the adjacent first pinned reference layer has a first pinned reference layer interface area, wherein the free layer interface area is less than the first pinned reference layer interface area.

3. The memory cell of claim 2 wherein the first pinned reference layer and the second pinned reference layer are the same structure.

4. The memory cell of claim 2 further comprising a first antiferromagnetic material (AFM) layer positioned between the first pinned reference layer and the substrate.

5. The memory cell of claim 2 further comprising a second antiferromagnetic material (AFM) layer, the second pinned reference layer positioned between the second AFM layer and the second nonmagnetic and insulating barrier layer.

6. The memory cell of claim 2 further comprising a first antiferromagnetic material (AFM) layer positioned between the first pinned reference layer and the substrate and a second antiferromagnetic material (AFM) layer, the second pinned reference layer positioned between the second AFM layer and the second nonmagnetic and insulating barrier layer.

7. The memory cell of claim 2 wherein the second pinned reference layer has a second pinned reference layer area that is constant and equal to the free layer interface area.

8. A magnetic memory cell on a substrate, the memory cell comprising:
   a ferromagnetic free layer having a magnetic anisotropy and a magnetization perpendicular to the substrate, the magnetization switchable by spin torque;
   a first pinned reference layer having a magnetic anisotropy and a magnetization pinned perpendicular to the substrate, the first pinned reference layer positioned between the substrate and the free layer;
   a first nonmagnetic and insulating barrier layer positioned between the free layer and the first pinned reference layer;
   a second pinned reference layer having a magnetic anisotropy and magnetization pinned perpendicular to the substrate, the free layer positioned between the first pinned reference layer and the second pinned reference layer; and a second nonmagnetic and insulating barrier layer positioned between the free layer and the second pinned reference layer;

wherein the first pinned reference layer and the second pinned reference layer are unbalanced synthetic antiferromagnetic (SAF) coupled structures, each unbalanced synthetic antiferromagnetic (SAF) coupled structure comprising two ferromagnetic layers separated by a metallic spacer and the two ferromagnetic layers have opposing magnetizations of unequal magnitude resulting in a net magnetization and the second pinned reference layer has a second pinned reference layer interface area and the adjacent free layer has a free layer interface area, wherein the second pinned reference layer interface area is less than the free layer interface area.

9. The memory cell of claim 8 wherein the second pinned reference layer has a second pinned reference layer area that is constant and less than the free layer interface area.

\* \* \* \* \*